(12) United States Patent
McDermott, III et al.

(10) Patent No.: US 9,425,804 B2
(45) Date of Patent: Aug. 23, 2016

(54) SYSTEM AND METHOD FOR CONTROLLING SUPERCONDUCTING QUANTUM CIRCUITS USING SINGLE FLUX QUANTUM LOGIC CIRCUITS

(71) Applicant: Wisconsin Alumni Research Foundation, Madison, WI (US)

(72) Inventors: Robert Francis McDermott, III, Madison, WI (US); Maxim G. Vavilov, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 53 days.

(21) Appl. No.: 14/298,268

(22) Filed: Jun. 6, 2014

(65) Prior Publication Data

US 2015/0358022 A1 Dec. 10, 2015

(51) Int. Cl.
*H03K 19/195* (2006.01)
*B82Y 10/00* (2011.01)

(52) U.S. Cl.
CPC .......... *H03K 19/1958* (2013.01); *B82Y 10/00* (2013.01)

(58) Field of Classification Search
CPC ..... G06N 99/002; B82Y 10/00; H01F 6/008; H01F 6/00; H01F 41/048; G01R 33/3815; G01R 33/34023; G01R 33/035; G01R 33/0354; H01F 6/003; H03K 19/195; H03K 3/38; H03K 17/92; H01L 39/223; H01L 39/2493; H01L 39/22; H01L 49/006; H01L 39/025
USPC ................. 326/1–7; 327/366–373, 527–529; 505/162, 164, 170, 204; 361/141
See application file for complete search history.

(56) References Cited

U.S. PATENT DOCUMENTS

| | | | | |
|---|---|---|---|---|
| 2003/0207766 | A1* | 11/2003 | Esteve | B82Y 10/00 505/190 |
| 2013/0196855 | A1* | 8/2013 | Poletto | H01L 39/04 505/170 |
| 2015/0263736 | A1* | 9/2015 | Herr | H03K 3/38 326/4 |

OTHER PUBLICATIONS

Barends, et al., Coherent Josephson Qubit Suitable for Scalable Quantum Integrated Circuits, Physical Review Letters, 2013, 111:080502, 10 pages.
Barends, et al., Logic Gates at the Surface Code Threshold: Superconducting Qubits Poised for Fault-Tolerant Quantum Computing, Nature, 2014, 508:500-503.

(Continued)

*Primary Examiner* — Alexander H Taningco
*Assistant Examiner* — Seokjin Kim
(74) *Attorney, Agent, or Firm* — Quarles & Brady, LLP

(57) ABSTRACT

A system and methods for controlling superconducting quantum circuits are provided. The system includes at least one superconducting quantum circuit described by multiple quantum states, and at least one single flux quantum ("SFQ") control circuit configured to generate a voltage pulse sequence that includes a plurality of voltage pulses temporally separated by a pulse-to-pulse spacing timed to a resonance period. The system also includes at least one coupling between the at least one superconducting quantum circuit and the at least one SFQ control circuit configured to transmit the voltage pulse sequence generated using the SFQ control circuit to the at least one superconducting quantum circuit. In some aspects, the system further includes a controller system configured to optimize the pulse-to-pulse spacing to minimize a gate infidelity due to at least one of a timing error, a timing jitter and a weak qubit anharmonicity.

20 Claims, 9 Drawing Sheets

(56) References Cited

OTHER PUBLICATIONS

Bialczak, et al., Fast Tunable Coupler for Superconducting Qubits, Physical Review Letters, 2011, 106:060501, 4 pages.
Bowdrey, et al., Fidelity of Single Qubit Maps, Physics Letters A, 2002, 294(5-6):258-260.
Bunyk, et al., RSFQ Technology: Physics and Devices, International Journal of High Speed Electronics and Systems, 2001, 11(1):257-305.
Bunyk, et al., Experimental Characterization of Bit Error Rate and Pulse Jitter in RSFQ Circuits, IEEE Transactions on Applied Superconductivity, 2001, 11(1):529-532.
Castellano, et al., Rapid Single-Flux Quantum Control of the Energy Potential in a Double SQUID Qubit Circuit, Superconductor Science and Technology, 2007, 20(6):500-505.
Chow, et al., Randomized Benchmarking and Process Tomography for Gate Errors in a Solid-State Qubit, Physical Review Letters, 2009, 102:090502, 6 pages.
Clarke, et al., Superconducting Quantum Bits, Nature, 2008, 453:1031-1042.
Devoret, et al., Superconducting Circuits for Quantum Information: An Outlook, Science, 2013, 339:1169-1174.
Fedorov, et al., Reading-out the State of a Flux Qubit by Josephson Transmission Line Solitons, Physical Review B, 2007, 75:224504, 13 pages.
Fedorov, et al., Fluxon Readout of a Superconducting Qubit, Physical Review Letters, 2014, 112:160502, 5 pages.
Fowler, et al., Surface Codes: Towards Practical Large-Scale Quantum Computation, Physical Review A, 2012, 86:032324, 54 pages.
Hassel, et al., Rapid Single Flux Quantum Devices with Selective Dissipation for Quantum Information Processing, Applied Physics Letters, 2006, 89:182514, 3 pages.
Herr, et al., Ultra-Low-Power Superconductor Logic, Journal of Applied Physics, 2011, 109:103903, 7 pages.
Knill, et al., Randomized Benchmarking of Quantum Gates, Physical Review A, 2008, 77:012307, 13 pages.
Koch, et al., Charge Insensitive Qubit Design Derived from the Cooper Pair Box, Physical Review A, 2007, 76:042319, 21 pages.
Likharev, et al., RSFQ Logic/Memory Family: A New Josephson-Junction Technology for Sub-Terahertz-Clock-Frequency Digital Systems, IEEE Transactions on Applied Superconductivity, 1991, 1(1):3-28.
Motzoi, et al., Simple Pulses for Elimination of Leakage in Weakly Nonlinear Qubits, Physical Review Letters, 2009, 103:110501, 4 pages.
Motzoi, et al., Optimal Control Methods for Fast Time-Varying Hamiltonians, Physical Review A, 2011, 84:022307, 10 pages.
Mukhanov, Energy-Efficient Single Flux Quantum Technology, IEEE Transactions on Applied Superconductivity, 2011, 21(3):760-769.
Ohki, et al., Picosecond On-Chip Qubit Control Circuitry, IEEE Transactions on Applied Superconductivity, 2005, 15(2):837-840.
Ohki, et al., Low-Jc Rapid Single Flux Quantum (RSFQ) Qubit Control Circuit, IEEE Transactions on Applied Superconductivity, 2007, 17(2):154-157.
Pedersen, et al., Fidelity of Quantum Operations, Physics Letters A, 2007, 367(1-2):47-51.
Rylyakov, et al., Pulse Jitter and Timing Errors in RSFQ Circuits, IEEE Transactions on Applied Superconductivity, 1999, 9(2):3539-3544.
Schreier, et al., Suppressing Charge Noise Decoherence in Superconducting Charge Qubits, Physical Review B, 2008, 77:180502(R), 5 pages.
Sporl, et al., Optimal Control of Coupled Josephson Qubits, Physical Review A, 2007, 75:012302, 9 pages.
Steffen, et al., Accurate Control of Josephson Phase Qubits, Physical Review B, 2003, 68:224518, 9 pages.
Takeuchi, et al., On-Chip RSFQ Microwave Pulse Generator Using a Multi-Flux-Quantum Driver for Controlling Superconducting Qubits, Physica C, 2010, 470:1550-1554.

* cited by examiner

SYSTEM AND METHOD FOR CONTROLLING SUPERCONDUCTING QUANTUM CIRCUITS USING SINGLE FLUX QUANTUM LOGIC CIRCUITS

BACKGROUND

The field of the disclosure is related to superconducting circuits. More particularly, the disclosure relates to systems and methods for controlling superconducting quantum circuits using single flux quantum ("SFQ") logic.

In the field of quantum computation, the performance of quantum bits ("qubits") has advanced rapidly in recent years, with preliminary multi-qubit implementations leading toward surface code architectures. In contrast to classical computational methods that rely on binary data stored in the form of definite on/off states, or bits, methods in quantum computation take advantage of the quantum mechanical nature of quantum systems. Specifically, quantum systems are described using a probabilistic approach, whereby a system includes quantized energy levels whose state may be represented using a superposition of multiple quantum-mechanical states.

Among several implementations currently being pursued, superconductor-based circuits present good candidates for the construction of qubits given the low dissipation inherent to superconducting materials, which in principle can produce coherence times necessary for performing useful quantum computations. In addition, because complex superconducting circuits can be micro-fabricated using conventional integrated-circuit processing techniques, scaling to a large number of qubits is relatively straightforward. In particular, superconducting circuits that include Josephson tunnel junctions, generally composed of two superconducting electrodes separated by a thin insulator, may be utilized for scalable quantum information processing in the solid state. Such Josephson junction-based superconducting circuits are advantageous on account of their strongly nonlinear behavior, which allows a breaking of degeneracy for the transition frequencies, and thus restricting system dynamics to specific quantum states.

Presently, gate and measurement fidelities are within reach of the threshold for fault-tolerant quantum computing based on topological surface codes, and hence there is interest in scaling quantum computing devices that include a few qubits to much larger, multi-qubit circuitry. However, a superconducting quantum computer that will outperform the best available classical machines may necessitate thousands if not millions of physical qubits, and hence the wiring architecture and control of a such large-scale quantum processor presents a formidable technical challenge.

Present systems for measurement and control of superconducting quantum circuits typically include low-temperature systems, such as dilution refrigeration units. Such systems are configured with microwave frequency generators and single-sideband mixing hardware that generate and transmit microwave electromagnetic signals to multiple superconducting circuits for purposes of measurement and control of the state of each qubit. However, such systems are limited in terms of wiring availability, as well as thermal and noise coupling to room temperature electronics. Hence, in applications involving cryogenic temperatures it is highly desirable to integrate as much of the control and measurement circuitry for a multi-qubit system as possible into in order to reduce wiring heat load, latency, power consumption, and the overall system footprint.

Given the above, there a need for systems and methods yielding scalable quantum computation that includes the ability to perform rapid high-fidelity control and measurement of both single qubits and multi-qubit parity, while controlling the resources utilized.

SUMMARY

The present disclosure overcomes the aforementioned drawbacks by providing a system and methods for controlling superconducting quantum circuits. Specifically, the present disclosure describes an approach for use in coherent manipulation of harmonic oscillator and qubit modes using a sequence of voltage pulses generated using single flux quantum ("SFQ") circuits. Particularly, the present disclosure utilizes coherent rotations obtained by using a pulse-to-pulse spacing timed to a period of a target oscillator. Advantageously, control by way of voltage pulses generated using SFQ circuits coupled to multiple superconducting quantum systems may be achieved in a low-temperature cryostat without need for applying microwave electromagnetic signals. As will be described, calculation of gate errors due to timing jitter of SFQ-derived voltage pulses and due to weak anharmonicity of a qubit demonstrate gate fidelities in excess of 99.9 percent are achievable for sequence lengths of, for example, roughly 20 nanoseconds.

In one aspect of the present disclosure, a quantum computing system is provided. The system includes at least one superconducting quantum circuit described by multiple quantum states, and at least one single flux quantum ("SFQ") control circuit configured to generate a voltage pulse sequence that includes a plurality of voltage pulses temporally separated by a pulse-to-pulse spacing timed to a resonance period. The system also includes at least one coupling between the at least one superconducting quantum circuit and the at least one SFQ control circuit configured to transmit the voltage pulse sequence generated using the SFQ control circuit to the at least one superconducting quantum circuit.

In another aspect of the present disclosure, a method for controlling superconducting quantum circuits is provided. The method includes providing at least one superconducting quantum circuit described by multiple quantum states and coupled to at least one single flux quantum ("SFQ") control circuit, and generating, using the at least one SFQ control circuit, a voltage pulse sequence that includes a plurality of voltage pulses temporally separated by a pulse-to-pulse spacing. The method also includes applying the voltage pulse sequence to the at least one superconducting quantum circuit to achieve an excitation consistent with a target transition between the multiple quantum states.

In yet another aspect of the present disclosure, a method for controlling superconducting circuits is provided. The method includes providing at least one superconducting quantum circuit described by multiple quantum states and coupled to at least one single flux quantum ("SFQ") circuit, and generating, using the at least one SFQ control circuit, a voltage pulse sequence that includes a plurality of voltage pulses temporally separated by a pulse-to-pulse spacing timed to a resonance period. The method also includes applying the voltage pulse sequence to the at least one superconducting quantum circuit to achieve an excitation consistent with a target transition between the multiple quantum states.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Previously, single flux quantum ("SFQ") superconducting circuits have been investigated as a high-speed and ultra low-power digital logic alternative to current CMOS-based integrated circuits. Specifically, at the heart of SFQ circuits are Josephson junctions, whose fast switching capabilities (on the order of a few picoseconds), provide a significant improvement over conventional approaches. The operating principle of the SFQ circuits is based on single 2π-leaps in the phase φ of overdamped Josephson junctions. Due to large damping, driven Josephson junctions never switch completely into the phase-running regime having a large average voltage across the junction, but instead generate short voltage pulses whose time integral equals the superconducting flux quantum $\Phi_0 = h/2e$. Generally, SFQ digital logic circuits generate, manipulate and store classical bits of information, or logical "0" and "1" values, using voltage pulses, or fluxons, that propagate ballistically along passive superconducting microstrip lines or active Josephson transmission lines.

There have been some experimental demonstrations implementing SFQ-based circuits for qubit biasing, along with fluxon-based schemes for qubit measurement. In addition, there has been a proposal to generate microwave pulses for qubit control using appropriately filtered SFQ pulse trains, although the required filter and matching sections would be challenging to realize practically. In spite of such work, there has been no compelling realization thus far of coherent control of quantum systems using direct excitation of system modes via SFQ-generated voltage pulses. This is because each single SFQ pulse produces a broadband excitation, which is not directly useful for coherent manipulation of quantum circuits, since it does not offer the possibility for providing selective excitation of individual transitions between quantum states.

By contrast, the present disclosure recognizes that superconducting quantum systems, such as qubits or resonator cavities, may be coherently controlled using voltage pulses generated using such SFQ circuits, as will be described. Specifically, systems and methods that implement resonant SFQ pulse sequences are provided for the coherent control of quantum system modes, such as qubit and resonator cavity modes. Examples of superconducting qubits include charge qubits, flux qubits, phase qubits, transmons, xmons, and so forth. As will be described, SFQ-based gates, in accordance with the present disclosure, are robust against leakage errors and timing jitter of the applied voltage pulses, with high achievable fidelities in nanosecond gate times.

Figure 1:
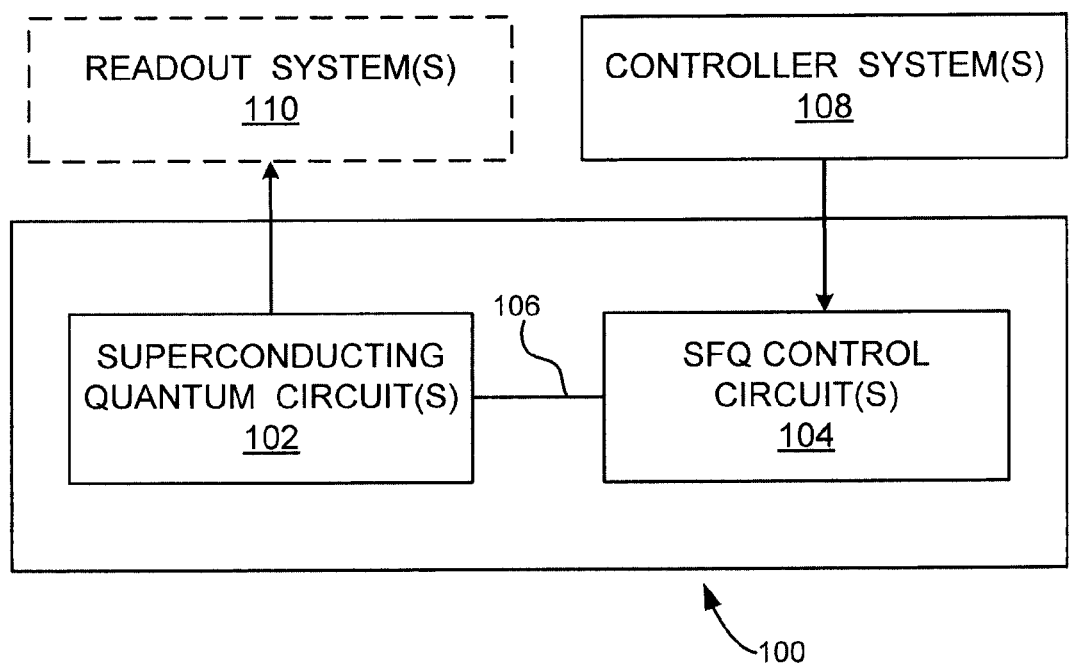
FIG. 1 is a schematic of a quantum computing system in accordance with the present disclosure.

Turning to FIG. 1, an example for a quantum computing system 100, in accordance with the present disclosure is shown. The quantum computing system 100 includes superconducting quantum circuit(s) 102, which may include a single or multiple superconducting qubits or resonator cavities, coupled to any single flux quantum ("SFQ") control circuit(s) 104, via one or more couplings 106. The superconducting quantum circuit(s) 102 may include any number of linear and nonlinear circuit elements, including Josephson junctions, inductors, capacitors, resistors, and so on. The quantum computing system 100 is configured to operate over a broad range of temperatures, including temperatures consistent with a superconducting state for materials configured therein.

In accordance with embodiments of the present disclosure, the SFQ control circuit(s) 104, which may include a number SFQ modules arranged in any manner, may be configured to generate a voltage pulse sequence, or pulse train. Specifically, the voltage pulse sequence may include any number of periodic or non-periodic voltage pulses, temporally separated by pulse-to-pulse spacings, for use in attaining target transitions between multiple quantum states describing the superconducting quantum circuits(s) 102. In some aspects, the pulse-to-pulse spacings may be timed to one or more resonance periods such that excitations consistent with target transitions between the quantum states of the superconducting quantum circuits(s) 102 are achieved. This may be accomplished via controller system(s) 108, which can include any electronic systems, hardware or circuitry components in communication with the SFQ control circuit(s) 104, and configured to initiate and control the timing and intensity of voltage pulses generated therefrom. For example, such controller system(s) 108 may include capabilities for providing signals of any amplitude, frequency, waveform, or duration, as input signals to the SFQ control circuit(s) 104, in the form of current, voltage, magnetic flux signals, and so forth. In some aspects, the controller system(s) 108 may be further configured to optimize the pulse-to-pulse sequence in order to minimize a gate infidelity due to any combination of timing errors, timing jitter and weak qubit anharmonicity, along with other errors.

The one or more couplings 106 providing a communication between the superconducting quantum circuit(s) 102 and SFQ control circuit(s) 104 may configured to transmit, modulate, amplify, or filter, the voltage pulse sequence generated using the SFQ control circuit(s) 104. Such couplings 106 may include any circuitry elements, including capacitive or inductive elements, passive superconducting microstrip lines, active Josephson transmission lines, including any number of Josephson junctions, and so forth. In some aspects, the controller system(s) 108 may further provide signals for modulating or tuning the one or more couplings 106.

In certain desired configurations, the one or more couplings 106 may be designed such that nonequilibrium quasiparticles generated in the SFQ control circuit(s) 104 are isolated from the superconducting quantum circuit(s) 102 in a manner intended to avoid the introduction of degrees of freedom leading to quantum decoherence. For example, quasiparticle poisoning can be mitigated by avoiding direct galvanic connection between the signal and ground traces of the SFQ control circuit(s) 104 and superconducting quantum circuit(s) 102.

In some configurations of the quantum computing system 100, a readout system(s) 110 in communication with the superconducting quantum circuit(s) 102 may also be included, whereby the readout system(s) 110 may be configured to provide readout information in relation to controlled quantum states of the superconducting quantum circuit(s) 102, in accordance with the present disclosure.

Figure 2:
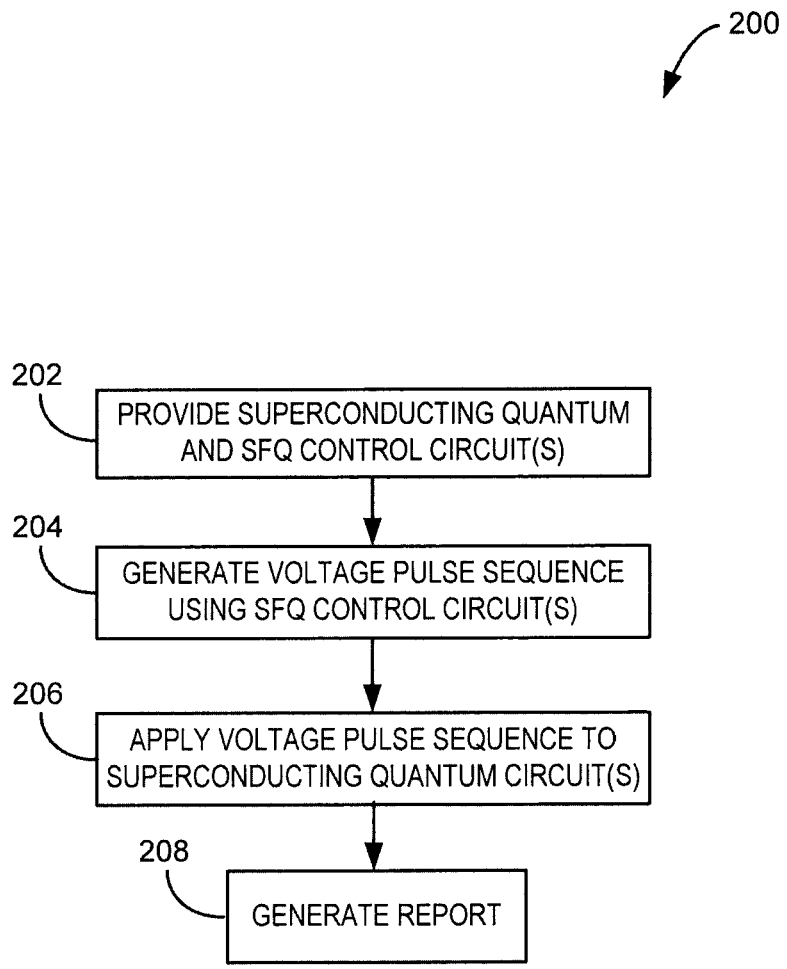
FIG. 2 is a flowchart setting forth steps of one example of a process for controlling superconducting quantum circuits in accordance with the present disclosure.

Turning to FIG. 2, a flowchart is shown setting forth steps of a process 200 for controlling superconducting quantum circuits with SFQ logic circuits, in accordance with the present disclosure. The process begins at process block 202 where any superconducting quantum circuit(s) and SFQ control circuit(s) are provided. As described, such superconducting quantum circuit(s) may include single or multi-qubit quantum systems or resonant cavities. At process block 204, a voltage pulse sequence, or pulse train, may be generated using the SFQ control circuits, via controller systems, hardware and circuit elements. The voltage pulse sequence may include any number of voltage pulses temporally separated by pulse-to-pulse spacings. In some aspects, a pulse-to-pulse spacing may be timed to one or more resonance periods of a superconducting quantum system in order to generate excitations consistent with target transitions between quantum states of the system. In addition, the pulse-to-pulse sequence may be optimized in order to minimize a gate infidelity due to any combination of timing errors, timing jitter and weak qubit anharmonicity, along with other errors.

At process block 206, the generated voltage pulse sequence is then applied to the superconducting quantum circuit(s) via at least one coupling to achieve target transitions between states of the quantum system(s). Then at process block 208 a report may be generated of any shape or form. Specifically, information with respect to states of the quantum system (s) may be obtained via signals from single or multiple readouts by way of readout system(s), as mentioned.

In previous approaches, control of superconducting qubits is generally accomplished using shaped microwave pulses that realize arbitrary rotations over the Bloch sphere. Amplitude modulation of a resonant carrier wave concentrates drive power at the frequency of interest, and the microwave pulses are shaped to minimize power at nearby transition frequencies to avoid excitation out of the qubit manifold. As described, such approaches are limited in their applicability to scalable quantum computing systems as would inherently necessitate complex and expensive resources.

Figure 3:
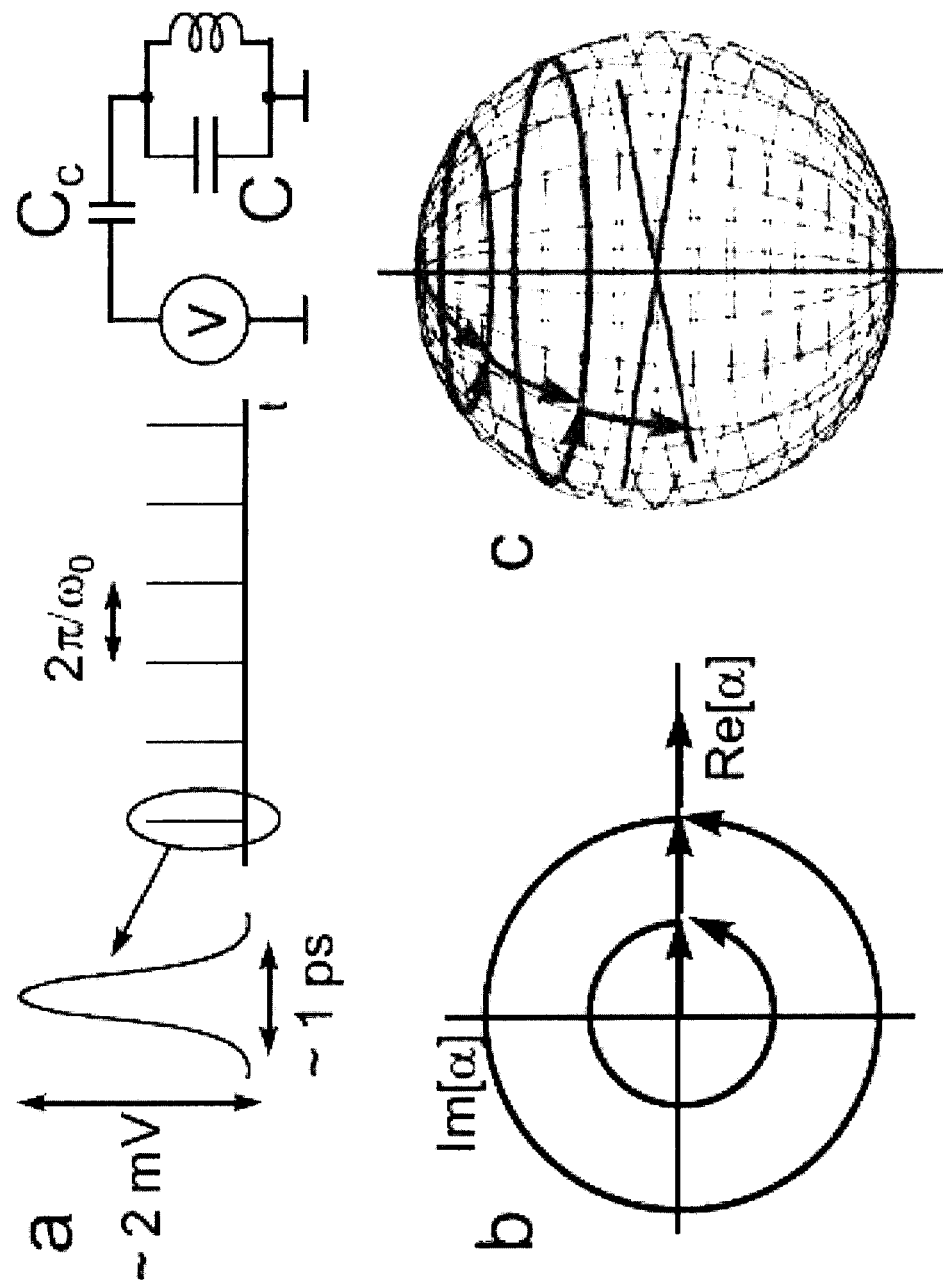
FIG. 3a is a schematic of an example single flux quantum ("SFQ") pulse sequence for achieving an excitation for a resonator coupled via a capacitance to a SFQ-based voltage source.
FIG. 3b shows a trajectory in quadrature space for a cavity driven by a resonant SFQ pulse sequence, accordance with the present disclosure.
FIG. 3c shows a trajectory on the Bloch sphere for a qubit driven with a resonant SFQ pulse sequence, in accordance with the present disclosure.

By contrast, in accordance with systems and methods of the present disclosure, intuition for the effectiveness of an arbitrary drive pulse in achieving a desired transition (or avoiding an undesired one) between quantum states, can be obtained by considering a simple classical model of an LC resonator. Specifically, a drive waveform is coupled to the resonator from a time-dependent voltage source V(t) through a coupling capacitance $C_c$ is considered, as shown in FIG. 3a. The energy deposited in such a resonator is given by:

$$E = \frac{\omega_0^2 c_c^2}{2C'}|\tilde{V}(\omega_0)|^2 \qquad (1)$$

where $C'=C+C_C$, $\omega_0=1/\sqrt{LC'}$ and where the tilde represents the Fourier transform $\tilde{V}(\omega)=\int_{-\infty}^{\infty}V(t)e^{j\omega t}dt$. The energy coupled to the resonator is proportional to the energy spectral destiny of the drive waveform at the resonator frequency.

Herein, the response of a microwave resonator to an SFQ pulse is of interest. For state-of-the-art Nb-based SFQ technology, characteristic pulse amplitudes are roughly 2 mV and pulse widths around 1 picosecond. As the pulse widths are much less than the period of the microwave resonator, an SFQ voltage pulse can be modeled as a Dirac δ-function V(t)=$\Phi_0\delta(t)$. In this case, $\tilde{V}(\omega)=\Phi_0$ and Eqn. (1) reduces to:

$$E_1 = \frac{\omega_0^2 C_c^2 \Phi_0^2}{2C'} \qquad (2)$$

where the subscript 1 indicates reference to the response to a single pulse. Because the SFQ pulse width is much smaller than the oscillator period, the energy deposited is quite insensitive to the detailed shape of the SFQ pulse, and is determined rather by the time integral of the pulse, which is precisely quantized to a single flux quantum. For example, for a Gaussian SFQ pulse with standard deviation $\tau$, the above result is modified by the pre-factor $e^{-\omega_0^2\tau^2}$, which yields a correction of 0.02% for $\tau=0.5$ ps and $\omega_0/2\pi=5$ GHz As mentioned, a single SFQ pulse produces a broadband excitation. For this reason, a single pulse is not useful for coherent manipulation of quantum circuits, since it does not offer the possibility to selectively excite individual transitions. The picture changes, however, when considering driving the resonator with a sequence of SFQ voltage pulses. Particularly, to coherently excite a resonator a pulse-to-pulse separation that is timed to the resonator period may be used. Such approach is analogous to pumping up a swing by giving a short push once per cycle, in contrast to sinusoidally forcing the swing throughout an entire period of oscillation. A driving voltage may then be considered as:

$$V_n(t)=\Phi_0[\delta(t)+\delta(t-T)+ \ldots +\delta(t-(n-1)T)] \qquad (3)$$

where T is the separation between pulses and n is the number of pulses. It may be found that the pulse sequence couples an energy to the resonator equal to:

$$E_n = \frac{\omega_0^2 C_0^2}{2C'} \frac{\sin^2(n\omega_0 T/2)}{\sin^2(\omega_0 T/2)} \qquad (4)$$

By way of example, it is worthwhile to consider the energy transferred by an SFQ pulse sequence to a typical cavity mode in a superconducting cQED circuit. By taking $\omega_0/2\pi=5$ GHz, C=1 pF, and $C_c=1$ fF, it is determined that a single SFQ pulse couples roughly $6\times10^{-4}$ quanta to the cavity mode. By contrast, for a resonant pulse sequence, in accordance with the present disclosure, with T equal to an integer multiple of cavity periods, the pulses add coherently, so that the total energy deposited in the cavity goes as $n^2$. Because of such quadratic scaling, about 40 pulses are required to populate the cavity with a single excitation, accomplished in a time of roughly $40\cdot 2\pi/\omega_0=8$ ns.

A recent proposal for cQED measurement based on microwave counting relies on the preparation of "bright" and "dark" cavity pointer states using a coherent drive pulse with length matched to the inverse detuning of the dressed cavity frequencies. This protocol is readily adapted to a SFQ excitation of the readout cavity. For a qubit-cavity system with dressed cavity resonances at $\omega_0-\chi$ or $(\omega_0+\chi)$ corresponding to the qubit $|0\rangle$ (or $|1\rangle$) states, an SFQ pulse train with interval $T=2/\pi(\omega_0+\chi)$ and total number of pulses $n=(\omega_0+\chi)/2\chi$ will coherently populate the cavity if the qubit is in the $|1\rangle$ state, while returning the cavity to the vacuum upon completion of the sequence if the qubit is in the $|0\rangle$ state.

By way of example, the response of the quantum oscillator to SFQ excitation is considered. The time-dependent circuit Hamiltonian is written as:

$$H = \frac{[\hat{Q} - C_C V(t)]^2}{2C'} + \frac{\hat{\Phi}^2}{2L} \quad (5)$$

The Hamiltonian may be decomposed into the unperturbed free Hamiltonian $H_{free}$ and a time-dependent excitation Hamiltonian $H_{SFQ}$:

$$H_{free} = \frac{\hat{Q}^2}{2C'} + \frac{\hat{\Phi}^2}{2L} \quad (6)$$

$$H_{SFQ} = -\frac{C_C}{C'} V(t) \hat{Q}$$

In terms of the usual raising and lowering operators, $$H_{free} = \hbar\omega_0 \hat{a}^\dagger \hat{a}, \quad (7)$$

$$H_{SFQ} = iC_C V(t) \sqrt{\frac{\hbar\omega_0}{2C'}} (\hat{a} - \hat{a}^\dagger).$$

The effect of the SFQ pulse is then to induce a coherent displacement of the cavity state by amount $$\alpha_{SFQ} = C_C \Phi_0 \sqrt{\frac{\omega_0}{2\hbar C'}} \quad (8)$$

as shown in FIG. 3b. The energy deposited by the pulse matches the classical expression (2). A sequence of n pulses produces a coherent state with amplitude $$\alpha_n = \alpha_{SFQ} \sum_{k=0}^{n-1} \exp(-ik\omega_0 T)$$

and mean energy $E_n = \rangle_0 |\alpha_n|^2$ consistent with the classical expression (4).

Next, by way of another example, the application of SFQ pulses may be considered for a two-level qubit. The Hamiltonian of the system becomes $$H_{free} = \frac{\hbar\omega_{10}}{2}(I - \hat{\sigma}_z) \quad (9)$$

$$H_{SFQ} = C_C V(t) \sqrt{\frac{\hbar\omega_{10}}{2C}} \hat{\sigma}_y,$$

where I is the identity matrix and $\hat{\sigma}_{y,z}$ are the usual Pauli matrices. In the limit of a short, intense SFQ pulse, a discrete rotation of the state vector about the y-axis by angle $\delta\theta$ is induced, namely $$\delta\theta = C_C \Phi_0 \sqrt{\frac{2\omega_{10}}{\hbar C}} \quad (10)$$

In between pulses, the qubit evolves under the influence of $H_{free}$. The SFQ pulse sequence may then induce coherent rotations when the free evolution periods are timed to the oscillation period $2\pi/\omega_{10}$ of the qubit, as shown in FIG. 3c. For a qubit initially in state $|0\rangle$, the resonant pulse sequence induces a coherent rotation in the xz-plane. For a pulse interval that is slightly mismatched from the oscillation period, the state vector slowly drifts away from the xz-plane, and in the limit of a large timing mismatch the state vector undergoes small excursions about the north pole of the Bloch sphere.

As may be appreciated from Eqn. 10, the angle of rotation induced by the SFQ pulse depends on the strength of the capacitive coupling to the qubit, which may be taken as fixed. While tunable inductive couplers have been demonstrated, it is unclear that they could be engineered to perform well on the picosecond timescales characteristic of an SFQ pulse. For that reason, it might prove advantageous to work with a fixed rotation angle once the coupling to the qubit is determined by the circuit design. For small rotation angle $\delta\theta\sim0.01$, the resulting gate error is at most $\delta\theta^2/4$. Moreover, this error can be further reduced by appropriately tailoring the timing delay between the SFQ pulses.

Other potential sources of errors in SFQ-based gates include timing jitter of the pulses and weak anharmonicity of the qubit. By way of example, in the following, the six eigenstates of the Pauli operators are taken as input states, and gate error is computed as the state error averaged over these input states; this approach is similar to interleaved random benchmarking with single-qubit Clifford gates.

The effect of a timing error $\delta t$ the SFQ pulse is to induce a spurious rotation of the state vector by angle $\omega_{10} \delta t \sin\theta$, where $\theta$ is the instantaneous polar angle of the state vector. It may be assumed that the arrival times of the individual pules are distributed normally with standard deviation $\sigma$. To consider the effect of timing jitter on rotations derived from SFQ pulse trains, the manner in which the SFQ circuit is clocked may need to be specified. Specifically, if the pulse train is derived from a stable external frequency source (used, for example, to trigger a DC/SFQ converter), the timing jitter per pulse is independent of the length of the pulse train. Timing errors associated with each pulse may be largely compensated by the following pulse, and error in the final pulse dominates error in the sequence as a whole. Pulse timing jitter leads to the average gate error $$1 - F_{avg}^{ext} = \frac{(\omega_{10}\sigma)^2}{6}\left[\frac{\Theta^2}{n} + 1\right] \tag{11}$$

where the superscript "ext" refers to the mode of clocking the SFQ pulse train from a stable source. For practical purposes this timing jitter will introduce negligible gate error.

Next, a more demanding case where pulse timing errors accumulate randomly is considered, so that the timing jitter in the nth pulse is $\sqrt{n}$ larger than the timing jitter in the initial pulse. This could be the situation, for example, when the SFQ pulse train is generated internally from an SFQ clock ring. In this case, the deviation of the state vector from the desired trajectory grows as $\sqrt{n}$ leading to a degradation of gate fidelity that scales linearly with n. The timing jitter results in an average gate error $$1 - F_{avg}^{int} = \frac{n(\omega_{10}\sigma)^2}{6}, \tag{12}$$

where the superscript "int" refers to the internal clock used to generate the pulse train.

In the thermal regime, the timing jitter of the SFQ pulse scales as the square root of temperature, and average timing jitter per junction of 0.2 ps has been measured in a large-scale SFQ circuit operated at 4.2 K. For an SFQ circuit operated at reduced temperature in a dilution refrigerator, the timing jitter is expected to be lower, although quantum fluctuations may lead to non-negligible jitter even for circuits operated at millikelvin temperatures. Moreover, if the SFQ pulse source is coupled to the qubit sample via a long Josephson transmission line consisting of N junctions, a qubit may see a $\sqrt{N}$ degradation of the timing jitter due to the sequential switching of the junctions in the line.

Figure 4:
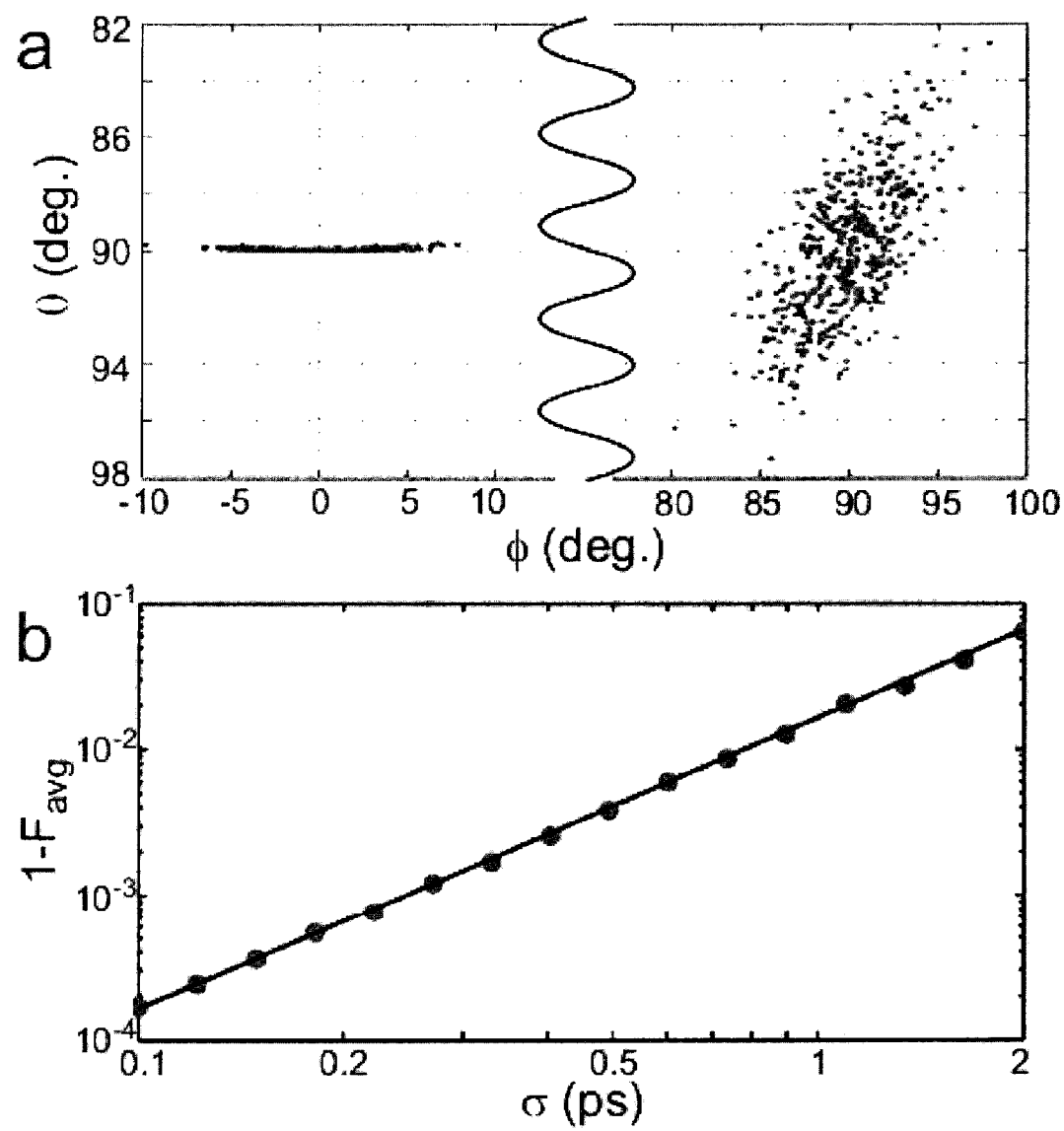
FIG. 4a is a graphical illustration of polar θ and azimuthal φ angles of the Bloch vector following an SFQ-based $(\pi/2)_y$ rotation for different realizations of timing jitter.
FIG. 4b is a graphical illustration of SFQ gate error versus jitter for an SFQ $(\pi/2)_y$ rotation.

By way of example, Monte Carlo simulations of gate error due to timing jitter for an SFQ $(\pi/2)_y$ rotation realized from 100 pulses were performed, in the case where timing errors of the pulse generator accumulate incoherently, cf. Eqn. (12). The results are shown in FIG. 4a-b. Specifically, for the $|0\rangle$ state input, timing errors lead predominantly to y-errors and result in an average infidelity given by Eqn. (33), as will be described. Small z-errors accumulate coherently and lead to a systematic underrotation of the state vector. For the input $(|0\rangle+i|1\rangle)/\sqrt{2}$ which ideally is unaffected by the $(\pi/2)_y$ rotation, timing errors initially provide kicks in the x-direction; once x-errors are allowed to accumulate, subsequent SFQ pulses generate additional z-errors. In FIG. 4b the average gate error versus pulse timing jitter σ is shown. For σ=0.2 ps, the average gate error is 6.6×10⁴.

A practical superconducting qubit is not an ideal two-level system. For a typical transmon qubit, the anharmonicity $(\omega_{10}-\omega_{21})/\phi_{10}$ is of order 4-5%. A single strong SFQ pulse may induce a large spurious population of the $|2\rangle$ state as a result of its broad band-width, and leakage errors induced by fast SFQ control pulses have been considered previously.

However, a resonant SFQ pulse train tailored to perform a desired rotation in the 0-1 subspace in a larger number of steps n, in accordance with the present disclosure, may show greatly reduced spectral density at $\omega_{21}$ enabling high-fidelity SFQ-based gates with acceptable leakage. Consider a three-level system with unperturbed Hamiltonian $$H_{free} = \begin{pmatrix} 0 & 0 & 0 \\ 0 & \hbar\omega_{10} & 0 \\ 0 & 0 & \hbar(\omega_{10}+\omega_{21}) \end{pmatrix} \tag{13}$$

The charge induced on the qubit capacitance by the SFQ pulse leads to the Hamiltonian $$H_{SFQ} = iC_C V(t)\sqrt{\frac{\hbar\omega_{10}}{2C}}\begin{pmatrix} 0 & -1 & 0 \\ 1 & 0 & -\sqrt{2} \\ 0 & \sqrt{2} & 0 \end{pmatrix} \tag{14}$$

Figure 5:
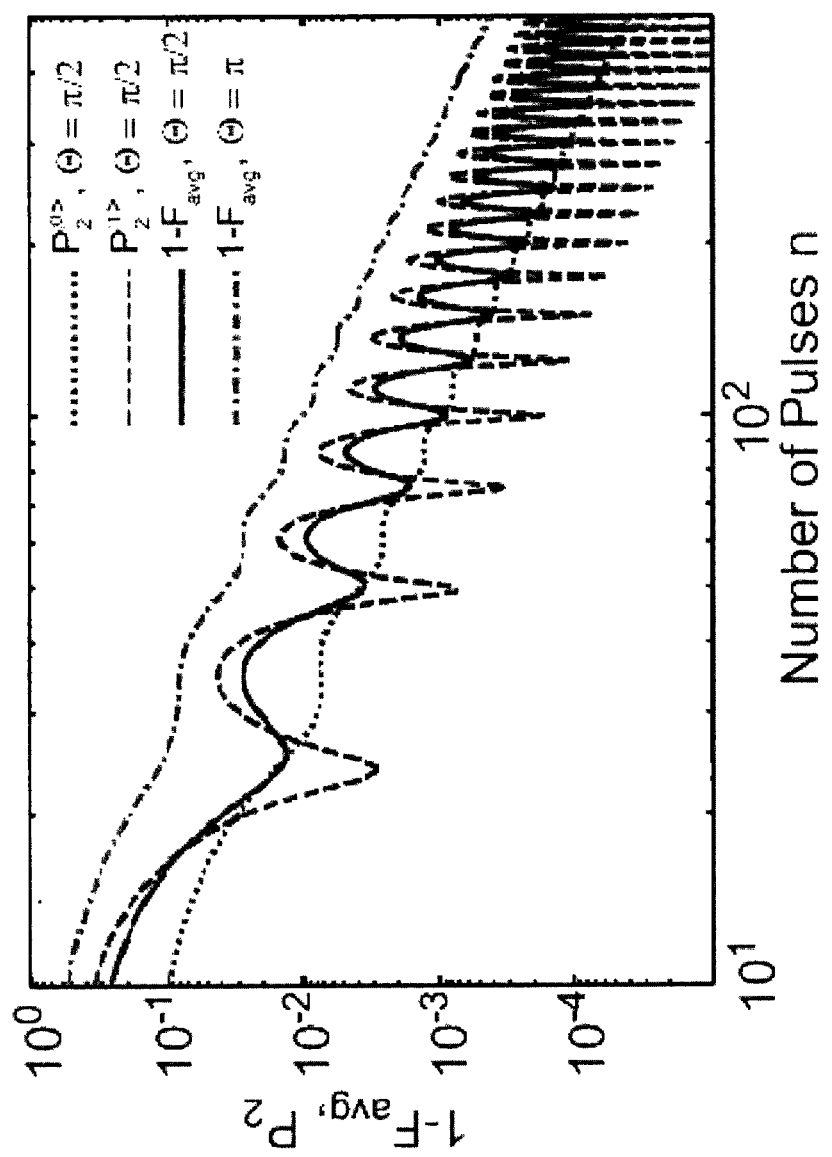
FIG. 5 is a graphical illustration of the average gate error and |2> state error for SFQ pulse trains versus number of pulses n.

Here, typical transmon parameters $\omega_{10}/2\pi=5$ GHz and $\omega_{21}/2\pi=4.8$ GHz are considered. Gate fidelity and $|2\rangle$ state errors for resonant SFQ pulse trains designed to produce $(\pi/2)_y$ and $\pi_y$ rotations for a range of total numbers of pulses (and hence gate durations) are examined. In addition, results for the $|2\rangle$ state leakage $\rangle$ for the $(\pi/2)_y$ gate for qubit states $|j\rangle=|0\rangle,|1\rangle$ are shown in FIG. 5. Gate error is dominated by leakage to the $|2\rangle$ state. Gate errors decrease as $n^{-2}$ by increasing the number of pulses and thus the total duration of the sequence, as one reduces the spectral weight of the pulse sequence at the 1-2 transition. Moreover, gate error exhibits an oscillatory behavior, with minima corresponding to points where there is destructive interference at the leakage transition. For the $(\pi/2)_y$ pulse, fidelity of 99.9% is achieved in 100 pulses, corresponding to a 20 ns gate time for a 5 GHz qubit, while for a π pulse 99.9% fidelity is achieved in around 300 pulses.

In analyzing error in qubit rotations realized from resonant trains of single flux quantum (SFQ) pulses, three sources of error are considered: (1) finite width and (2) timing jitter of the SFQ pulses, and (3) leakage of the qubit wave function to the second excited state. For accessible SFQ pulse parameters, gate errors due to all three sources are shown to be suppressed well below $10^{-3}$.

Specifically, the ideal SFQ-based gate, where coherent rotations are realized from 5 function pulses with no timing error and where the qubit is treated as an ideal two-level system, is compared to the actual SFQ-based gate, where the pulses have finite width and timing jitter and where weak anharmonicity of the qubit is explicitly taken into account. The state-averaged overlap fidelity of a qubit gate is computed as follows:

$$F_{avg}(\mathcal{U}_{id},\mathcal{U}_G) = \frac{2+|Tr(\mathcal{U}_{id}^\dagger \mathcal{U}_G)|^2}{6} \tag{15}$$

where $\mathcal{U}_{id}$ is the unitary time evolution operator for the ideal gate and $U_G$ corresponds to the actual gate. To evaluate fidelity of SFQ-based rotations by angle θ about the y-axis, let $$\mathcal{U}_{id} = \exp\left(\frac{i\Theta\hat{\sigma}_y}{2}\right) \qquad (16)$$

This rotation may be composed from n smaller rotations by angle $\delta\theta=\theta/n$ about the y-axis, interspersed with appropriate free precession intervals that are matched to the Larmor period $2\pi/\omega_{10}$ of the qubit. The unitary operator describing the $\delta$-function pulses is given as follows:

$$U_\delta^{(1)} = \exp\left(\frac{i\delta\theta\hat{\sigma}_y}{2}\right) \qquad (17)$$

Similarly, free precession for interval t is described by the unitary operator $$U_f(t) = \exp\left(\frac{i\omega_{10}t\hat{\sigma}_z}{2}\right) \qquad (18)$$

The actual evolution operator $U_G$ may be composed of a product of single-pulse evolution operators $\mathcal{U}_G^{(1)}$ and free evolutions between pulses. It may be assumed that the SFQ pulse vanishes outside the time interval $(-t_c,t_c)$ and that the evolution during the pulse is defined by the differential equation $$i\hbar\frac{\partial U_G^{(1)}(t)}{\partial t} = H(t)U_G^{(1)}(t) \qquad (19)$$

with the initial condition $U_G^{(1)}(-t_c)=1$. The evolution operator at time $t_c$ thus defines the overall effect of a single pulse on the qubit state: $\mathcal{U}_G^{(1)}(\delta\theta)=U_G^{(1)}(-t_c)$ In the following, the structure of the actual evolution operators $U_G(\theta)$ and gate infidelity for three sources of error are considered.

Finite Pulse Width

To consider the effect of the finite SFQ pulse width, begin by considering rectangular SFQ pulses with width $2t_c$. The full Hamiltonian during the pulse is $$H = \frac{\hbar\omega_{10}}{2}(I-\hat{\sigma}_z) - \frac{\hbar\delta\theta}{4t_C}\hat{\sigma}_y \qquad (20)$$

where $\delta\theta$ is the rotation angle induced by a single pulse. The corresponding evolution operator during the pulse represents precession in the field $(0, \delta\theta/2t_C, \omega_{10})$ and has the form, $$\mathcal{U}_{rect}^{(1)}=\exp(i(2\omega_{10}t_C\hat{\sigma}_z+\delta\theta\hat{\sigma}_y)/2). \qquad (21)$$

In the $\delta$-function approximation, the evolution during the same time interval would be $$\mathcal{U}_{id}^{(1)}=\exp(i\omega_{10}t_C\hat{\sigma}_z/2)\mathcal{U}_\delta^{(1)}\exp(i\omega_{10}t_C\hat{\sigma}_z/2) \qquad (22)$$

Using Eqn. 15, the overlap error $1-F_{1,rect}$ for a single pulse up to fourth order in $t_c$ and $\delta\theta$ is obtained:

$$1-F_{1,rect} = \frac{1}{216}\left(\delta\theta^4\omega_{10}^2t_C^2 + \delta\theta^2\omega_{10}^4t_C^4 - \frac{\delta\theta^4\omega_{10}^4t_C^4}{5}\right) \qquad (23)$$

Figure 6:
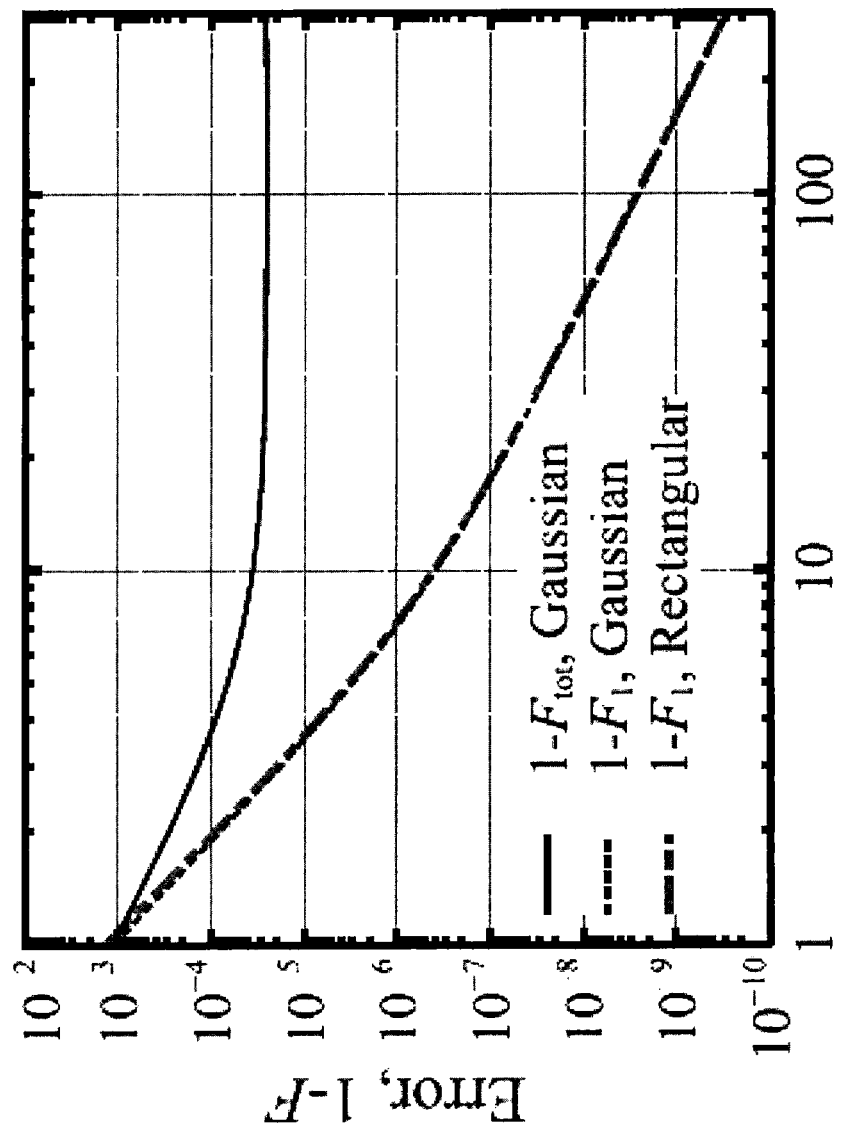
FIG. 6 is a graphical illustration showing the dependence of gate error on number pulses n used to realize a $(\pi/2)_y$ rotation for SFQ pulses of finite width.

This expression gives the important message that for short pulses, to the lowest order in $\omega_{10}t_C$, the error decreases as $\delta\theta^4$ for decreasing $\delta\theta$ However, for very small $\delta\theta\lesssim\omega_{10}t_C$ the error becomes quadratic in the rotation angle $\delta\theta$. The gate error due to rectangular pulses is shown in FIG. 6 as a dash-dotted trace.

Next, a SFQ pulse may be modeled by a Gaussian shape of width $\tau$:

$$V(t) = \frac{\Phi_0}{\sqrt{2\pi}\tau}e^{-t^2/2\tau^2} \qquad (24)$$

The time-dependent Hamiltonian is given by:

$$H(t) = \frac{\hbar\omega_{10}}{2}(I-\hat{\sigma}_z) + \frac{\hbar\delta\theta}{2\sqrt{2\pi}\tau}e^{-(t-t_k)^2/2\tau^2}\hat{\sigma}_y \qquad (25)$$

where $t_k$ is the arrival time of the SFQ pulse. The time evolution operator for the full Gaussian pulse is denoted $\mathcal{U}_{Gauss}^{(1)}$, and this operator is computed over the interval $(-t_C, t_C)$, where $t_C=5\tau$. It is assumed that the SFQ pulse vanishes outside of the time interval and that qubit evolution is described by the free evolution operator $U_f(2\pi/\omega_{10}-2t_C)$ during the time $2\pi/\omega_{10}-2t_C$. The gate error for a single Gaussian SFQ pulse can be evaluated according to Eqn. 15 and the result is also shown in FIG. 6 as a dotted trace. The error for the Gaussian pulse closely follows the result for rectangular pulses with proper choice of $\tau$.

In addition, the fidelity of a gate consisting of a resonant train of n Gaussian SFQ pulses that is designed to realize a rotation by angle $\theta=n\delta\theta$ about the y axis is analyzed. The gate evolution operator is written as $$\mathcal{U}_G(\theta)=[U_f(2\pi/\omega_{10}-t_C)\mathcal{U}_{Gauss}^{(1)}(\delta\theta)U_f(-t_C)]^n \qquad (26)$$

Substituting this expression to Eqn. 15, the gate fidelity can be obtained. In FIG. 6, the gate error as a function of the number of pulses n for $\theta=\pi/2$ and for Gaussian pulses with width $\tau=4$ ps is shown. The average gate error for a full rotation is observed to be $n^2$ times larger than the error of a single pulse, $1-F_{avg}=n^2(1-F_1)$. For larger values of n, the single pulse error scales as $1/n^2$ [cf. Eqn. 23] and the average gate error $1-F_{avg}\propto(\omega_{10}\tau)^4\theta^2$ becomes independent of n, while remaining below $10^4$ due to the factor $(\omega_{10}\tau)^4$. Note that in these simulations very long pulse times are assumed compared to what is achieved in practical SFQ circuits (where pulse widths $\tau<1$ ps are readily accessible) in order to circumvent numerical errors associated with finite machine precision; the scaling of gate error with pulse duration can be understood from Eqn. 23. For practical SFQ pulses, error associated with finite pulse duration may be much smaller than the other two errors analyzed below.

Pulse Timing Jitter

Figure 7:
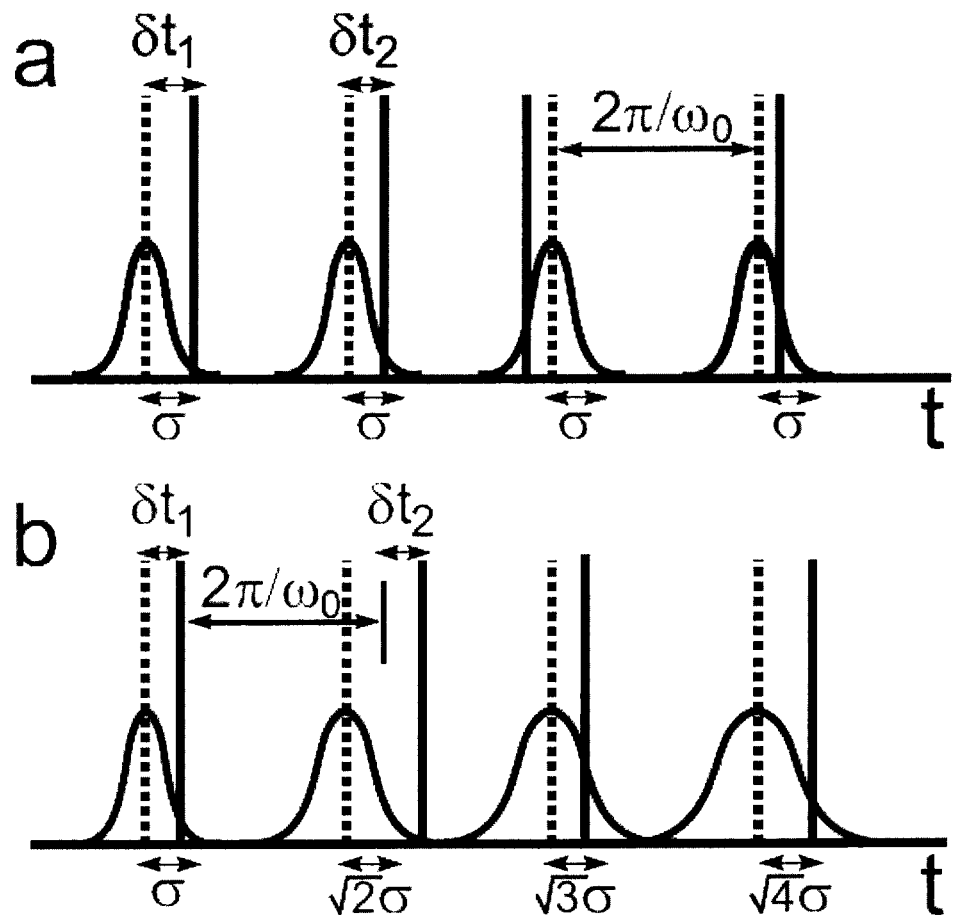
FIGS. 7a and 7b provide a schematic illustration of SFQ pulse timing jitter for internal and external clocking modes.

Small variation in the arrival times of the SFQ pulses presents another source of gate error. As described, the effect of timing jitter on SFQ gate fidelity depends on the manner in which the SFQ timing generator is triggered. Hence, the following two cases are considered: (1) External clock. Here, the SFQ pulses are derived from a stable external clock, so that the timing error per pulse does not grow with the length of the sequence. (2) Internal clock. Here, there is fixed error in the pulse-to-pulse spacing, so that errors in the timing of individual pulses accumulate incoherently as the length of the sequence grows. The effect of these two different clocking modes on pulse timing jitter is depicted schematically in FIGS. 7a and 7b. These two cases are examined in detail below. For further discussion, an alternative expression to evaluate gate fidelity is utilized:

$$F_{avg} = \frac{1}{6}\sum_{\alpha} F_\alpha, \quad (27)$$

$$F_\alpha = Tr\{\mathcal{U}_G \rho_\alpha \mathcal{U}_G^\dagger \mathcal{U}_{id} \rho_\alpha \mathcal{U}_{id}^\dagger\}$$

where the average is performed over the Pauli eigenstates $\rho_\alpha = |\alpha\rangle\langle\alpha|$ aligned along directions $\alpha = \pm x, \pm y, \pm z$.

External Clock

The effect of timing jitter on pulse trains derived from a stable external clock is analyzed. It is assumed that the pulse arrival times are distributed normally with respect to the external clock with distribution with $\sigma$. For small jitter, $\omega_{10}\sigma \ll 1$, $F_\alpha$ is evaluated using the following analysis. The evolution of a qubit is characterized by a sequence of discrete rotations, Eqn. 17, interspersed with intervals of free precession that are nominally matched to the qubit period $2\pi/\omega_{10}$. Due to pulse timing jitter, the actual free precession interval between the (k−1)th and kth pulses becomes $2\pi/\omega_{10}+\delta t_k - \delta t_{k-1}$, where $\delta t_k$ is the timing error associated with the kth pulse. For a qubit state vector that is initially aligned along the z-axis, the timing error causes the state to acquire a component $\delta y_k$ in the y-direction:

$$\delta y_k = \omega_{10}(\delta t_k - \delta t_{k-1})\sin(k\delta\theta) \quad (29)$$

Here $k\delta\theta$ is the instantaneous polar angle of the qubit state vector. During the gate operation, the qubit state vector accumulates the error $\delta Y = \Sigma_k \delta y_k$, finding:

$$F_z = 1 - \overline{\delta Y^2}/4 \quad (30)$$

$$\overline{\delta Y^2} = (\omega_{10}\sigma)^2\left[\sin^2(n\delta\theta) + \delta\theta^2\sum_{k=1}^{n-1}\cos^2(k\delta\theta)\right],$$

where the overbar represents an average over pulse jitter times $\delta t_k$. Assuming that $\delta\theta = \theta/n$ is small, the summation may be replaced by integration in the last expression and finding $$F_x = 1 - (\omega_{10}\sigma)^2\left[\frac{\Theta^2}{8n}\left(1+\frac{\sin 2\Theta}{2\Theta}\right)+\frac{\sin^2\Theta}{4}\right] \quad (31)$$

for a qubit state initially aligned along the z-direction.

For a qubit state initially aligned along the x-axis, the analysis is the same with the replacement of $\sin(k\delta\theta)$ with $\cos(k\delta\theta)$ in Eqn. 29. In this case $$F_x = 1 - \left[\frac{\Theta^2}{8n}\left(1-\frac{\sin 2\Theta}{2\Theta}\right)+\frac{\cos^2\Theta}{4}\right](\omega_{10}\sigma)^2 \quad (32)$$

In the above expressions for $F_x$ and $F_z$, a small error along the z-direction is disregarded, which is higher order in $\omega_{10}\sigma$.

In the case of a qubit state vector initially aligned along the y-axis, the state vector remains close to the y-axis, and after each free precession acquires an error in the x-direction $\delta y_k \cong \omega_{10}(\delta t_k - \delta t_{k-1})$. This error is then rotated by the remaining n−k pulses in xz plane, resulting in the accumulation of total gate error along the x- and z-directions $\delta X = \Sigma_k \delta t_k \cos(\Theta - k\delta\theta)$ and $\delta Z = \Sigma_k \delta t_k \sin(\Theta - k\delta\theta)$. For a qubit state initially aligned along the y-axis, the gate fidelity is $$F_y = 1 - \frac{\overline{\delta X^2}}{4} - \frac{\overline{\delta Z^2}}{4} \quad (33)$$

Evaluating the summations for $\delta X$ and $\delta Z$ under the assumption of uncorrelated $\delta t_k$, the following is obtained $$F_y = 1 - \frac{(\omega_{10}\sigma)^2}{4}\left(\frac{\Theta^2}{n}+1\right) \quad (34)$$

The average gate error is computed from Eqn. 27, yielding $$F_{avg} = 1 - \frac{(\omega_{10}\sigma)^2}{6}\left(\frac{\Theta^2}{n}+1\right). \quad (35)$$

Internal Clock

Next, gate fidelity is evaluated for a system where the SFQ pulses are clocked internally in such a way that the time interval between pulses fluctuates independently, so that error in the arrival times of individual pulses accumulates incoherently. The free evolution is determined by the time interval $2\pi/\omega_{10}+\delta t_k$, where $\delta t_k$ is normally distributed and uncorrelated from pulse to pulse. Due to the timing error, a qubit state vector initially aligned along the z-direction acquires a spurious component $\delta t_k = \delta t_k \sin(k\delta\theta)$ along the y-axis. Thus $\overline{\delta Y^2} = (\omega_{10}\sigma)^2 \Sigma_k \sin^2(k\delta\theta)$. Following the same procedure described in the previous section, the gate fidelity is found to be $$F_z = 1 - \frac{n(\omega_{10}\sigma)^2}{8}\left[1-\frac{\sin 2\Theta}{2\Theta}\right]. \quad (36)$$

For a pure state initially aligned along the x-axis, $$F_x = 1 - \frac{n(\omega_{10}\sigma)^2}{8}\left[1+\frac{\sin 2\Theta}{2\Theta}\right]. \quad (37)$$

For states initially aligned along the y-axis, error accumulates along both the x- and z-directions, as discussed in the previous section. Evaluating the corresponding gate errors $\overline{\delta X^2}$ and $\overline{\delta Z^2}$, the following expression is found $$F_y = 1 - \frac{\overline{X^2}}{4} - \frac{\overline{Z^2}}{4} \simeq 1 - \frac{n(\omega_{10}\sigma)^2}{4}. \quad (38)$$

The gate fidelity averaged over all qubit states is then given by $$F_{avg} = 1 - \frac{n(\omega_{10}\sigma)^2}{6} \quad (39)$$

Figure 8:
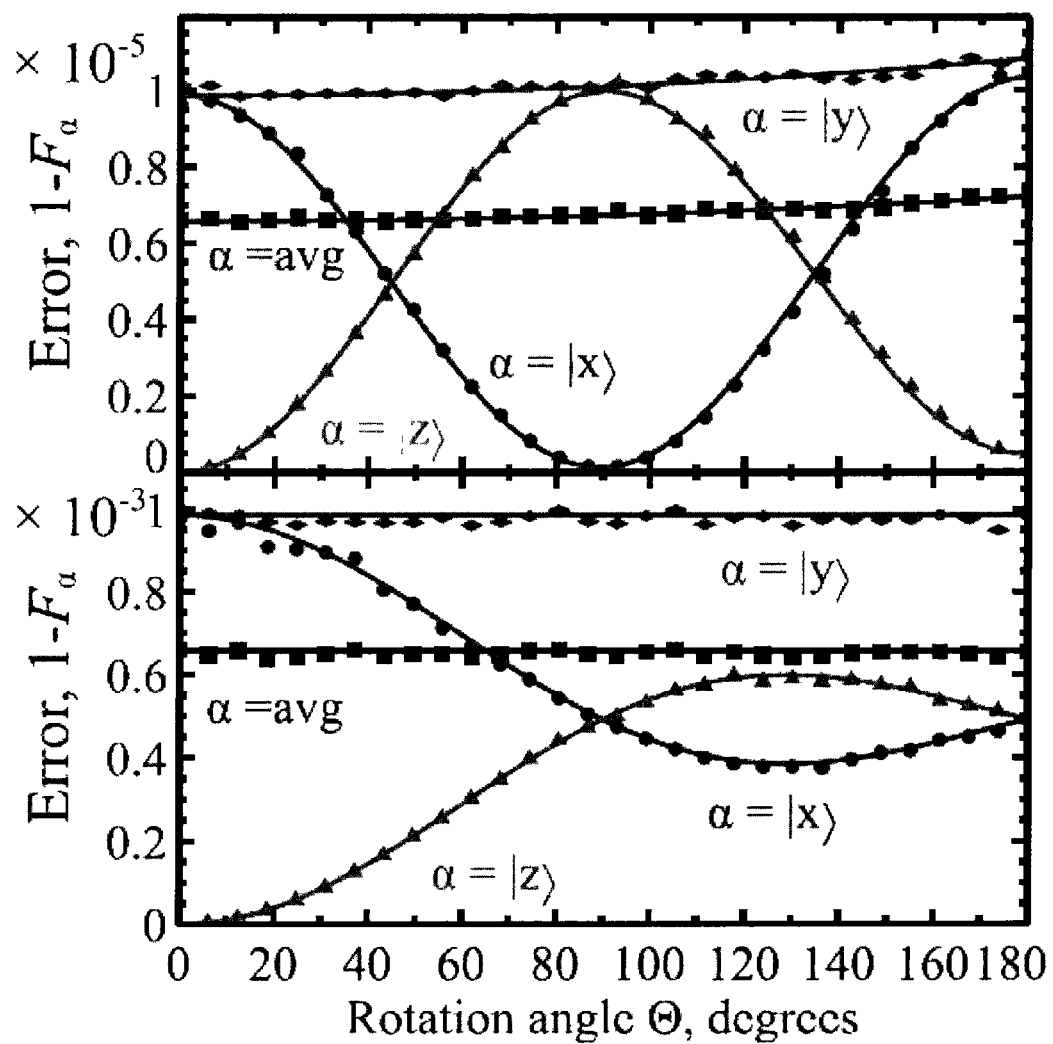
FIG. 8 is a graphical illustration showing the dependence of gate error due to pulse timing jitter on rotation angle θ for SFQ pulses generated by an external clock (top panel) and an internal clock (bottom panel).

The SFQ gate error in the presence of timing jitter as a function of rotation angle θ for pure initial states aligned along directions α={x, y, z} was numerically evaluated, taking σ=0.2 ps and n=100. For a given realization of timing jitter {δt_k}, the overlap of the final qubit state was calculated with the corresponding state obtained by the ideal gate, Eqn. 16, and then the overlap was averaged over $10^4$ realizations of {δt_k}. The results are shown in the upper and lower panels of FIG. 8 for external and internal gating of the SFQ pulses, respectively. The simulation results are plotted as points, and the lines represent the analytical expressions derived above.

Higher Energy Levels of the Qubit

Finally, the effect of weak qubit anharmonicity on SFQ gate fidelity is analyzed. The qubit is treated as a three-level system with anharmonicity $\eta=(\omega_{10}-\omega_{21})/\omega_{10}$. The Hamiltonian is given by Eqns. 13 and 14. The corresponding time evolution operator is a three-dimensional unitary matrix and the definition for the average fidelity has to be modified accordingly. However, given the interest in averaging over the two-level qubit subspace of the system Hilbert space, the average fidelity reduces to $$F_{avg}(\mathcal{U}_{id}, \mathcal{U}_G) = \frac{Tr\{\mathcal{U}_G^\dagger P \mathcal{U}_G P\} + |Tr\{P\mathcal{U}_{id}^\dagger \mathcal{U}_G\}|^2}{6} \quad (40)$$

where P is the projection operator on the qubit subspace. This expression for fidelity is consistent with Eqn. 27 provided the following modified three-dimensional unitary operator is used to describe evolution under the ideal gate:

$$U_{id} = \begin{pmatrix} \cos(\Theta/2) & \sin(\Theta/2) & 0 \\ -\sin(\Theta/2) & \cos(\Theta/2) & 0 \\ 0 & 0 & 1 \end{pmatrix} \quad (41)$$

The error of a $\theta_y$ gate due to the presence of the second excited state is evaluated by summing the spurious amplitude of the |2⟩ state induced by pulse k as $$\delta\psi_{2,k}^{|j\rangle} = \exp(2\pi i\eta(n-k))(\delta\theta/\sqrt{2})\psi_{1,k-1}^{|j\rangle}, \text{ where}$$

$\psi_{1,k-1}^{|j\rangle}$ is the probability amplitude of the qubit being in the first excited state at time of pulse k if it was initially in state |j⟩ with j=0,1. Here the factor exp(2πiη(n−k)) represents the phase acquired by the second excited state over the remainder of the sequence following the kth pulse. Performing summation over n SFQ pulses, the probability of excitation to the second excited state is obtained as:

$$p_2^{|j\rangle} = \frac{\Theta^2}{8n^2}\left|\frac{1-e^{in(2\pi\eta+\delta\theta/2)}}{1-e^{i(2\pi\eta+\delta\theta/2)}} - (-1)^j\frac{1-e^{in(2\pi\eta-\delta\theta/2)}}{1-e^{i(2\pi\eta-\delta\theta/2)}}\right|^2 \quad (42)$$

Here it is assumed that the |1⟩ state amplitudes $\psi_{1,k}^{|0\rangle}$=sin (kδθ/2) and $\psi_{1,k}^{|0\rangle}$ cos(kδθ/2) are not significantly modified by the small amount of leakage to the second excited state, and direct |0⟩→|2⟩ transitions are disregarded.

Numerical analysis of the average fidelity $F_{avg}$ of $(\pi/2)_y$ and $\pi_y$ gates in the case of weak qubit anharmonicity is shown in FIG. 5, where $F_{avg}$ vs. number of SFQ pulses n for a qubit with spectrum $\omega_{10}/2\pi$=5 GHz and $\omega_{21}/2\pi$=4.8 GHz is shown. For the $(\pi/2)_y$ gate, the probabilities $P_2$ of qubit excitation to the |2⟩ state for the qubit initially in the ground (dotted line) or the first excited state (dashed line) are also plotted. It is noteworthy that the numerically evaluated curves for $P_2$ are well described by Eqn. 42 for n≳10. As mentioned, the fidelity decreases as $n^{-2}$ for large n, in addition to displaying an oscillating component that is more pronounced for smaller gate rotation angle θ.

Figure 9:
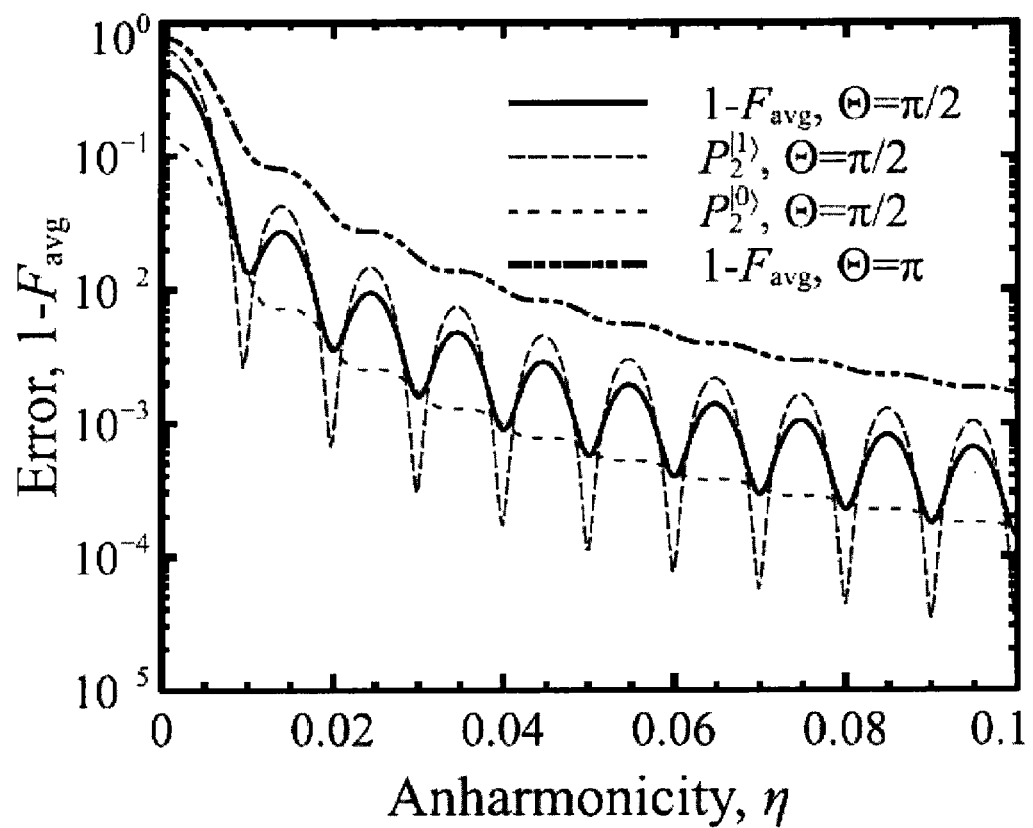
FIG. 9 is a graphical illustration showing the dependence of gate error on qubit anharmonicity for $(\pi/2)_y$ (solid line) and $\pi_y$ (dash-double-dot line) rotations.

In FIG. 9 the average gate error as a function of anharmonicity η for $(\pi/2)_y$ and $\pi_y$ gates realized using n=100 SFQ pulses is shown. The infidelity drastically decreases for n≳1/n and then exhibits a slower decrease with a minimum at η=½. The oscillations of $1-F_{avg}$ have the period Δη≳1/n and nearly disappear for a $\pi_y$ rotation. In FIG. 9, the |2⟩ state occupation $p_2^{|j\rangle}$ following the $(\pi/2)_y$ rotation for the qubit initially in state |j⟩ is also shown. A comparison of numerical calculations of $p_2^{|j\rangle}$ with Eqn. 42 shows that the two agree well for |η|≳1/n.

Simulations, as described herein, indicate that errors due to weak qubit anharmonicity and SFQ timing jitter are roughly of the same order ~$10^{-3}$ for SFQ pulse trains consisting of around 100 pulses, corresponding to 20 ns for a π/2 rotation of a 5 GHz qubit. While these errors are non-negligible, they are nevertheless small enough to enable robust qubit control with fast gates at error levels below the threshold for a fault-tolerant superconducting surface code. Gate errors could be suppressed further by a simple circuit redesign to increase qubit anharmonicity or by efforts to improve the timing stability of the SFQ circuit. Herein, only simple SFQ pulse trains have been considered, although other pulse sequences are possible. Specifically, state-of-the-art SFQ timing generators should allow the realization of robust sequences with arbitrary inter-pulse delays. In addition, it is anticipated that optimal control tools such as those used to optimize microwave-based single qubit gates and fast two-qubit gates could also be employed to modify SFQ sequences with controlled inter-pulse delays designed to suppress |2⟩ state errors and increase gate speed and/or fidelity over the naive gate sequences considered here.

Due to technical complexities of transmitting SFQ pulses from chip to chip, the practical realization of SFQ-based qubit gates may require the on-chip integration of the qubit circuit with at least a handful of SFQ elements. While in the past the high static dissipation of SFQ circuits has presented an obstacle to milliKelvin-scale temperature operation, the recent development of low-power biasing schemes for reciprocal quantum logic (RQL) and energy efficient SFQ logic (eSFQ) opens the door to the integration of SFQ and qubit circuits on the same chip. Care must be taken to isolate the qubit circuit from nonequilibrium quasiparticles generated in the SFQ control circuit; however, quasiparticle poisoning of the qubit circuit can be mitigated by avoiding direct galvanic connection between the signal and ground traces of the SFQ and qubit circuits. The ability to generate fluxons in close proximity to the qubit circuit may provide a high degree of robustness to the SFQ-based rotations, due to the quantization of flux associated with the SFQ pulses.

In conclusion, the present disclosure provides a system and methods for the high-fidelity coherent manipulation of quantum systems modes using resonant trains of SFQ pulses. The SFQ pulse trains can be generated locally in a qubit cryostat without need for external microwave generators. Taken together with a recent proposal to map the quantum information in a cQED circuit to a binary digital output using Josephson microwave photon counter, the approach of the present disclosure points in a direction toward the integration of large scale superconducting quantum circuits with cold control and measurement circuitry based on SFQ digital logic.

The present invention has been described in terms of one or more preferred embodiments, and it should be appreciated that many equivalents, alternatives, variations, and modifications, aside from those expressly stated, are possible and within the scope of the invention.

The invention claimed is:

1. A quantum computing system comprising:
    at least one superconducting quantum circuit described by multiple quantum states;
    at least one single flux quantum ("SFQ") control circuit configured to generate a voltage pulse sequence that includes a plurality of voltage pulses temporally separated by a pulse-to-pulse spacing timed to a resonance period; and
    at least one coupling extending between the at least one superconducting quantum circuit and the at least one SFQ control circuit and configured to transmit the voltage pulse sequence generated using the SFQ control circuit to the at least one superconducting quantum circuit.

2. The system of claim 1, wherein the at least one superconducting quantum circuit includes at least a qubit circuit.

3. The system of claim 1, wherein the at least one superconducting quantum circuit includes at least a resonant cavity circuit.

4. The system of claim 1, wherein the resonance period is consistent with a target transition between the multiple quantum states.

5. The system of claim 1 further comprising a controller system configured to optimize the pulse-to-pulse spacing to minimize a gate infidelity due to at least one of a timing error, a timing jitter and a weak qubit anharmonicity.

6. The system of claim 1, wherein the coupling includes at least one of a capacitive coupling and an inductive coupling.

7. The system of claim 1, wherein the coupling includes a Josephson transmission line consisting of multiple Josephson junctions.

8. A method for controlling superconducting quantum circuits, the method comprising:
    providing at least one superconducting quantum circuit described by multiple quantum states and coupled to at least one single flux quantum ("SFQ") control circuit;
    generating, using the at least one SFQ control circuit, a voltage pulse sequence that includes a plurality of voltage pulses temporally separated by a pulse-to-pulse spacing; and
    applying the voltage pulse sequence to the at least one superconducting quantum circuit to achieve an excitation consistent with a target transition between the multiple quantum states.

9. The method of claim 8, wherein the at least one superconducting quantum circuit includes at least a qubit circuit.

10. The method of claim 9, wherein applying the voltage pulse sequence to the qubit circuit generates discrete rotations interspersed with free precession intervals timed to a qubit period.

11. The method of claim 8, wherein the at least one superconducting quantum circuit includes at least a resonant cavity circuit.

12. The method of claim 8, wherein the pulse-to-pulse sequence is timed to a resonance period of the at least one superconducting quantum circuit.

13. The method of claim 12, wherein the resonance period is consistent with the target transition.

14. The method of claim 8 further comprising optimizing the pulse-to-pulse spacing to minimize a gate infidelity due to at least one of a timing error, a timing jitter and a weak qubit anharmonicity.

15. A method for controlling superconducting quantum circuits, the method comprising:
    providing at least one superconducting quantum circuit described by multiple quantum states and coupled to at least one single flux quantum ("SFQ") circuit;
    generating, using the at least one SFQ control circuit, a voltage pulse sequence that includes a plurality of voltage pulses temporally separated by a pulse-to-pulse spacing timed to a resonance period; and
    applying the voltage pulse sequence to the at least one superconducting quantum circuit to achieve an excitation consistent with a target transition between the multiple quantum states.

16. The method of claim 15, wherein the at least one superconducting quantum circuit includes at least a qubit circuit.

17. The method of claim 16, wherein applying the voltage pulse sequence to the qubit circuit generates discrete rotations interspersed with free precession intervals timed to a qubit period.

18. The method of claim 15, wherein the at least one superconducting quantum circuit includes at least a resonant cavity circuit.

19. The method of claim 15, wherein the resonance period is consistent with the target transition.

20. The method of claim 15 further comprising optimizing the pulse-to-pulse spacing to minimize a gate infidelity due to at least one of a timing error, a timing jitter and a weak qubit anharmonicity.

* * * * *